United States Patent
Fedde et al.

(10) Patent No.: US 8,091,222 B2
(45) Date of Patent: Jan. 10, 2012

(54) METHOD FOR FORMING AN ADAPTER APPARATUS USING CURABLE MATERIAL

(75) Inventors: Mickiel P. Fedde, Eagan, MN (US); Kenneth I. Krawza, Prior Lake, MN (US)

(73) Assignee: Ironwood Electronics, Inc., Eagan, MN (US)

(*) Notice: Subject to any disclaimer, the term of this patent is extended or adjusted under 35 U.S.C. 154(b) by 0 days.

(21) Appl. No.: 12/792,921

(22) Filed: Jun. 3, 2010

(65) Prior Publication Data

US 2010/0236064 A1    Sep. 23, 2010

Related U.S. Application Data

(62) Division of application No. 11/069,102, filed on Mar. 1, 2005.

(60) Provisional application No. 60/549,315, filed on Mar. 2, 2004.

(51) Int. Cl.
*H01R 9/00* (2006.01)
*H05K 3/00* (2006.01)

(52) U.S. Cl. ............. 29/842; 29/846; 174/256; 361/761

(58) Field of Classification Search .................. 174/255, 174/256, 262; 361/760, 761, 779; 29/832, 29/840, 842, 846, 852
See application file for complete search history.

(56) References Cited

U.S. PATENT DOCUMENTS

| | | | |
|---|---|---|---|
| 3,971,610 A | 7/1976 | Buchoff et al. | |
| 4,070,077 A | 1/1978 | Clark | |
| 4,393,438 A * | 7/1983 | Schelhorn | 361/761 |
| 4,421,368 A | 12/1983 | Saban | |
| 4,586,607 A | 5/1986 | Dubbs et al. | |
| 5,076,794 A | 12/1991 | Ganthier | |
| 5,418,471 A | 5/1995 | Kardos | |
| 5,691,041 A | 11/1997 | Frankeny et al. | |
| 5,702,255 A | 12/1997 | Murphy et al. | |
| 5,712,768 A | 1/1998 | Werther | |
| 5,742,481 A | 4/1998 | Murphy et al. | |
| 5,770,891 A | 6/1998 | Frankeny et al. | |
| 5,810,607 A | 9/1998 | Shih et al. | |
| 5,876,219 A | 3/1999 | Taylor et al. | |
| 5,892,245 A | 4/1999 | Hilton | |
| 6,007,348 A | 12/1999 | Murphy | |
| 6,325,280 B1 | 12/2001 | Murphy | |
| 6,352,437 B1 | 3/2002 | Tate | |
| 6,409,521 B1 | 6/2002 | Rathburn | |
| 6,764,313 B2 | 7/2004 | Hougham | |
| 6,981,879 B2 | 1/2006 | Kuczynski et al. | |
| 2005/0196979 A1 | 9/2005 | Fedde et al. | |

* cited by examiner

*Primary Examiner* — Donghai D. Nguyen
(74) *Attorney, Agent, or Firm* — Mueting, Raasch & Gebhardt, P.A.

(57) ABSTRACT

An adapter apparatus and methods for using in providing such adapter apparatus include providing a substrate having a plurality of openings defined therethrough. A plurality of conductive elements are mounted within corresponding openings thereof using a curable material.

9 Claims, 7 Drawing Sheets

*Fig.* 2
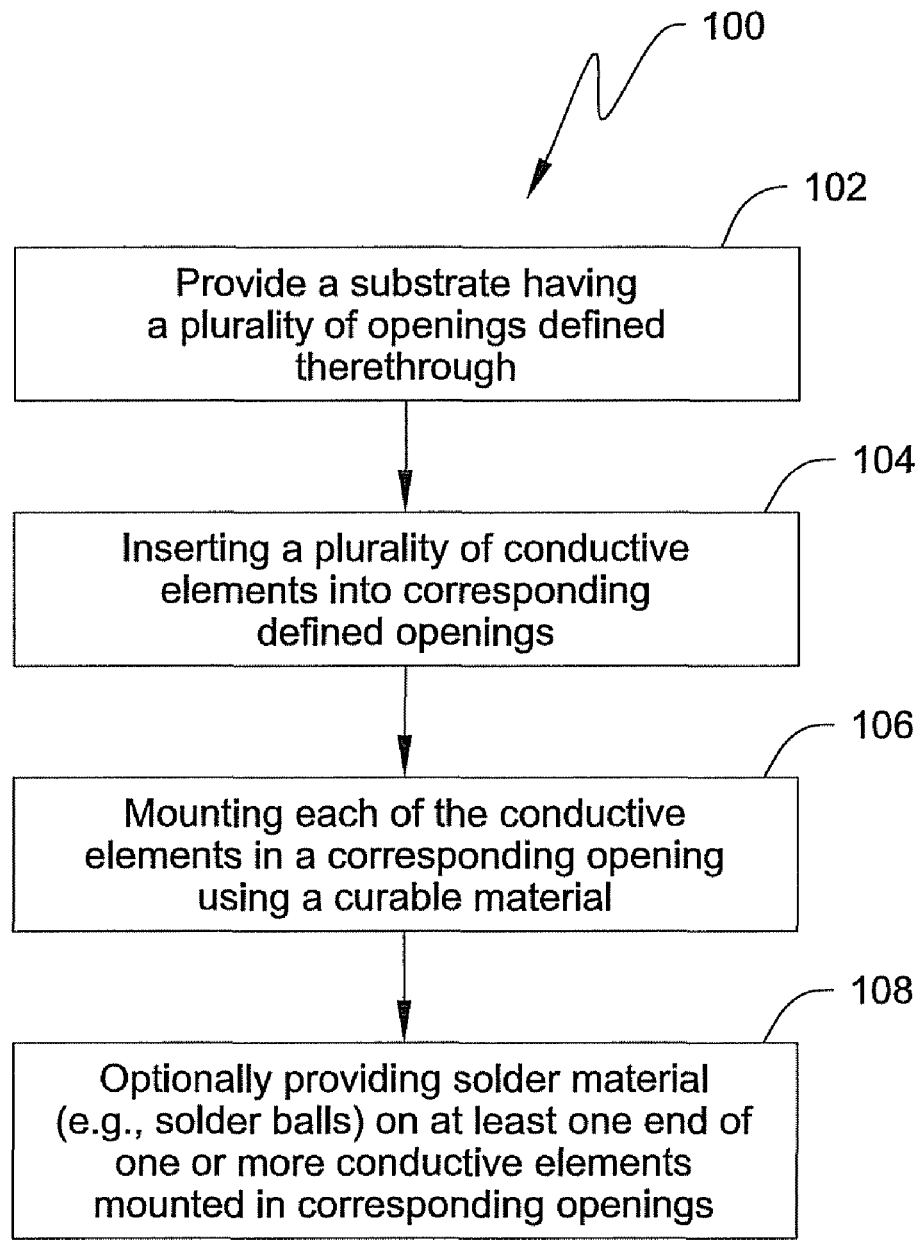

*Fig.* 6
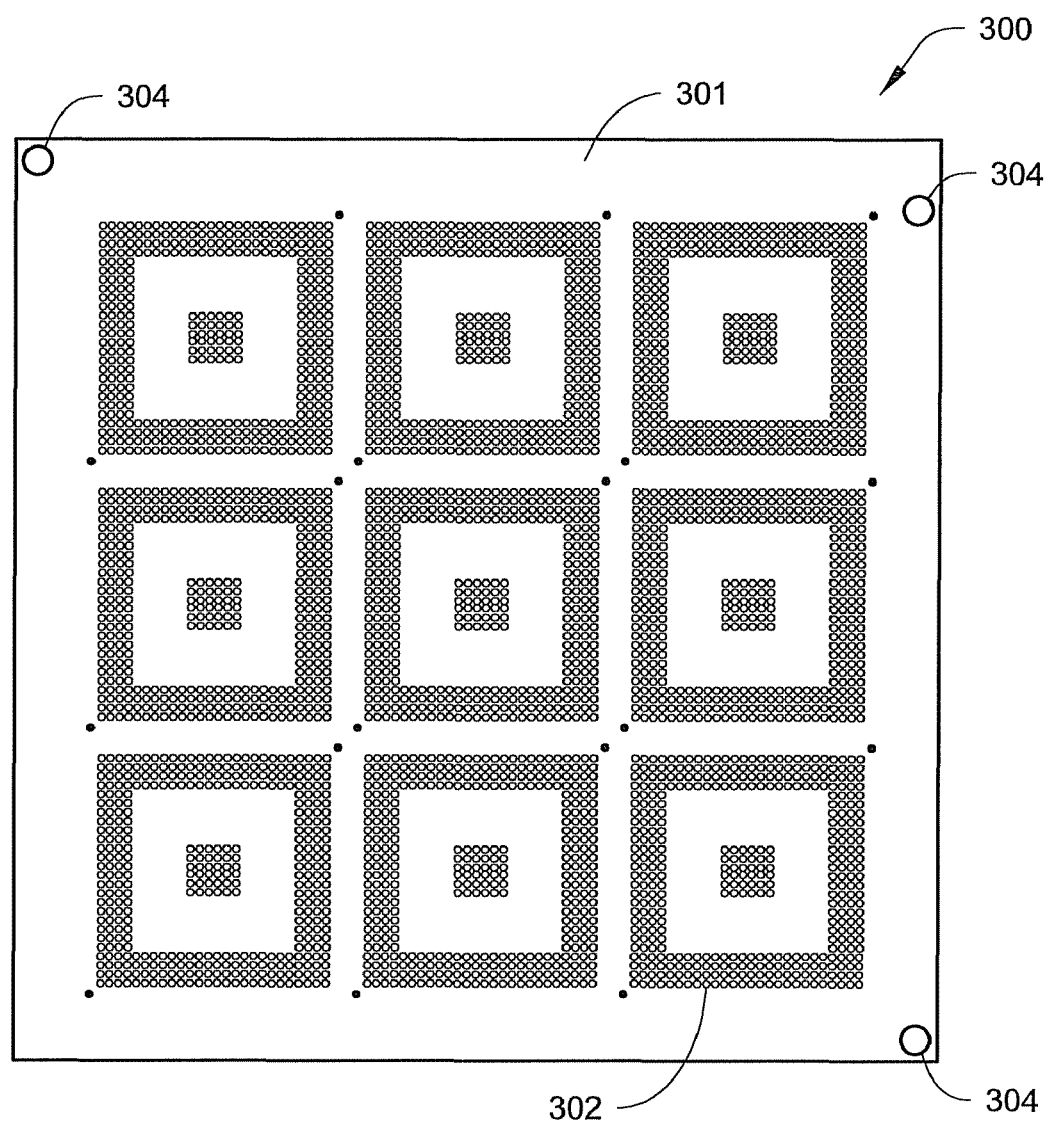

METHOD FOR FORMING AN ADAPTER APPARATUS USING CURABLE MATERIAL

CROSS-REFERENCE TO RELATED APPLICATION

This application is a divisional application of U.S. application Ser. No. 11/069,102, filed 1 Mar. 2005, which claims the benefit of U.S. Provisional Application Ser. No. 60/549,315 filed 2 Mar. 2004, all of which are incorporated herein by reference in their entireties.

BACKGROUND OF THE INVENTION

The present invention relates generally to adapters for use with packaged devices or other adapter apparatus (e.g., ball grid array (BGA) packages, land grid array or other surface mount devices, male pin adapters, female socket adapter apparatus, etc.).

Certain types of integrated circuit packages are becoming increasingly popular due to their occupancy area efficiency. In other words, they occupy less area on a target board on which they are mounted while providing a high density of contact terminals. For example, one such high density package type is a ball grid array package.

Generally, ball grid array packages contain an integrated circuit having its die bond pads electrically connected to respective conductive solder spheres that are distributed on the bottom surface of the package in an array. A target printed circuit board typically has formed on its surface a corresponding array of conductive pads which align with the array of solder spheres for electrically mounting the ball grid array package on the target board.

The target board typically includes other conductive traces and elements which lead from the array of conductive pads used for mounting the ball grid array package to other circuitry on the board for connecting various components mounted thereon. Typically, to mount such a ball grid array package to a target board, the package is positioned with the array of solder spheres corresponding to the array of conductive pads on the target board. The resulting structure is then heated until the solder spheres are melted and fused to the conductive pads of the target board.

Such area efficient packaging (e.g., ball grid array packages) provide a high density of terminals at a very low cost. Also, this packaging provides for limited lead lengths. Limited lead lengths may reduce the risk of damage to such leads of the package, may provide for higher speed product, etc.

Generally, circuit boards and/or components mounted thereon are tested by designers as the circuit boards are being developed. For example, for a designer to test a circuit board and/or a ball grid array package mounted thereon, the designer must first electrically connect the solder spheres on the ball grid array package to the target circuit board. As described above, this generally includes mounting the ball grid array package on the target board and heating the solder spheres to fuse the solder spheres to the conductive pads of the target board. Therefore, the package may be prevented from being used again. It is desirable for various reasons to use package adapters for mounting the packages and reuse ball grid array packages after testing. For example, such ball grid array packages may be relatively expensive. Further, for example, once attached, the solder spheres are not accessible for testing. In addition, it is often difficult to rework the circuit board with packages soldered thereon.

Various adapters which are used for electrically connecting the ball grid array package to a target printed circuit board are known. For example, U.S. Pat. No. 6,007,348 to Murphy, issued 28 Dec. 1999, entitled "Solder Sphere Terminal," and U.S. Pat. No. 6,325,280 to Murphy, issued 4 Dec. 2001, entitled "Solder Sphere Terminal," describe several adapter apparatus for use in mounting ball grid array packages. For example, as described therein, various intercoupling components are provided. In one of such components, an insulative support member includes a plurality of terminal elements positioned within holes extending through the insulative support member. The terminal elements are sized to be press-fit within the holes of the insulative support member.

The intercoupling components described in U.S. Pat. No. 6,007,348 and U.S. Pat. No. 6,325,280, as well as other conventional devices, in many instances have terminals (e.g., female socket pins) that are press-fit into openings formed in an insulative material configured for receiving a mating terminal (e.g., female socket pins configured to receive male pins). However, such press-fitting of terminals into openings of such insulative support materials present one or more varied problems.

For example, the press-fitting of pins in the insulative material cause stresses to the material that can cause the part when loaded with a plurality of pins to warp. Such warping may especially be evident when the adapter apparatus including the press-fit terminals is exposed to heat (e.g., such as during a reflow process).

Further, press-fitting of pins into openings of such an adapter apparatus can cause micro-fracturing of the insulative material when the holes are sized too tightly (e.g., with intolerable tolerances). Such micro-fracturing of the insulative materials undesirably allows for solder during further processing to flow to undesirable locations of the apparatus (e.g., the fractures of the insulative materials). Such solder flow may cause soldering to the target board to fail with loss of yield on an initial production run.

Yet further, in many circumstances, substrates which have terminals that are press-fit within openings defined therethrough (e.g., when press-fitting a female socket pin into openings of an adapter substrate) require the need for multiple hole sizes to be formed to permit the press-fit to effectively hold the terminal in place. The hole sizes in the substrate generally require tight control in dimension to make sure that solder does not migrate up or along the terminal (e.g., socket pin) during processing. Such a tightly controlled dimensional substrate is relatively expensive to manufacture. Still further, the use of press-fit terminals also yields problems due to the difficulty of controlling a drilling process for forming the openings, if drilling is used to form such openings in the adapter substrate.

SUMMARY OF THE INVENTION

To eliminate problems associated with press-fit terminal adapters, and problems associated with other conventional adapters, the present invention uses curable material to mount conductive elements (e.g., female socket pins, male terminal pins, etc.) in openings defined through an adapter substrate.

An adapter apparatus according to one exemplary embodiment of the present invention includes a substrate having a plurality of openings defined therethrough. The adapter apparatus further includes a plurality of conductive elements. Each conductive element is mounted in a corresponding opening of the plurality of openings using a curable material. One or more of the conductive element includes at least a first end configured to receive solder material thereon.

In one or more embodiments of the adapter apparatus, the conductive elements may include female socket pins, a male terminal pin, or conductive elements comprising two ends configured to receive solder material on at least one of the ends (e.g., a conductive plug).

In another embodiment, the adapter apparatus further includes a plurality of solder balls. Each solder ball is attached to the first end of a corresponding conductive element of the plurality of conductive elements mounted within the plurality of openings defined in the substrate.

In yet another embodiment of the adapter apparatus, at least one of the plurality of conductive elements includes an outer surface. A portion of the outer surface interfaces with the curable material when the conductive element is mounted in a corresponding opening. A positioning element extends from the outer surface to maintain spacing between the outer surface of the conductive element and one or more opening surfaces defining the corresponding opening.

Yet further, in another adapter apparatus embodiment, at least one of the plurality of conductive elements includes an outer surface, with a portion of the outer surface interfacing with the curable material when the conductive element is mounted in a corresponding opening. The conductive element further includes a curable material blocking element extending from the outer surface to prevent curable material used to mount the conductive element from passing between a first portion of the corresponding opening to a second portion of the corresponding opening when the conductive element is mounted therein.

In yet another embodiment, the conductive elements are mounted in the plurality of openings with the plurality of openings being configured to correspond to a contact element pattern of a surface mount device. For example, the surface mount device may include a ball grid array package, a land grid array package, a micro lead frame device, a column grid array package, etc.

Yet further, an adapter apparatus may include at least one conductive element that includes a body member extending between a first end configured for receiving solder material and a second end. The first end is accessible at a first surface of the substrate for receiving solder material, and a second end of the conductive element is accessible at a second surface of the substrate when the at least one conductive element is mounted in an opening defined through the substrate of the adapter apparatus. A curable material receiving region is provided between the body member and one or more surfaces defining the opening in which the conductive element is mounted. The curable material, in at least a portion of the curable material receiving region proximate the first surface of the substrate, blocks entry of material into the opening in which the conductive element is mounted.

A method for use in forming an adapter apparatus according to the present invention includes providing a substrate having a plurality of openings defined therethrough. Each of the plurality of openings is defined by at least one opening surface. Each of the plurality of openings is configured to receive one of a plurality of conductive elements. The method further includes inserting each of the plurality of conductive elements into a corresponding opening of the plurality of openings such that a curable material receiving region is provided in each opening between at least a portion of the at least one opening surface defining the opening and the conductive element inserted therein. Each of the plurality of conductive elements is mounted in the corresponding opening using a curable material provided to the curable material receiving region.

In one embodiment of the method, one or more of the plurality of conductive elements includes at least a first end for receiving solder material thereon. The method may further include positioning solder material (e.g., attaching a solder ball) on the first end of one or more of the plurality of conductive elements mounted in the corresponding openings.

In one embodiment of the method, mounting each of the plurality of conductive elements in the corresponding opening includes providing curable material to the curable material receiving region and curing the curable material to mount the conductive element in the corresponding opening. Further, the process includes removing excess cured material to expose the first end of the conductive element.

Yet further, in one embodiment of the method, a thermal treatment prior to curing may be performed to decreased the viscosity of the curable material. Excess curable material having the decreased viscosity may be removed prior to further thermal treatment employed to cure the curable material.

Yet further, in one embodiment of the method, each of the plurality of conductive elements may include a body member extending between the first end configured for receiving solder material and a second end. The first end is accessible at a first surface of the substrate for receiving the solder material when the conductive element is mounted in the corresponding opening. Mounting each of the plurality of conductive elements in the corresponding opening using the curable material further includes completely blocking entry of material into the corresponding opening after the curable material proximate the first surface of the substrate is cured.

Yet further, in one embodiment of the method, mounting each of the plurality of conductive elements includes filling the curable material receiving region entirely or at least partially to hold the conductive element in position within the corresponding opening.

Still further, in one embodiment of the method, inserting each of the plurality of conductive elements into a corresponding opening includes positioning each of the conductive elements in a corresponding opening such that spacing between an outer surface of the conductive element and one or more opening surfaces defining the corresponding opening is maintained as the conductive element is mounted in the corresponding opening.

In yet another embodiment of the method, the method includes preventing the curable material used to mount the conductive element from passing between a first portion of the corresponding opening to a second portion of the corresponding opening when the conductive element is mounted therein.

Another adapter apparatus according to the present invention includes a substrate. A plurality of openings are defined through the substrate (e.g., configured to correspond to a contact element pattern of a surface mount device). The adapter apparatus further includes a plurality of conductive elements. Each conductive element is mounted within a corresponding opening of the plurality of openings using a curable material. At least one of the plurality of conductive elements includes a body member extending between a first end and a second end. The first end of the at least one conductive element is accessible at a first surface of the substrate and the second end of the at least one conductive element is accessible at a second surface of the substrate when the at least one conductive element is mounted in the corresponding opening. A curable material receiving region is provided between the body member and one or more surfaces defining the corresponding opening to receive the curable material in at least a portion thereof to mount the at least one conductive element.

In one embodiment of the adapter apparatus, the adapter apparatus further includes solder material positioned on the first end of one or more of the plurality of conductive elements (e.g., a female socket pin, a male terminal pin, or a conductive plug element).

The above summary of the present invention is not intended to describe each embodiment or every implementation of the present invention. Advantages, together with a more complete understanding of the invention, will become apparent and appreciated by referring to the following detailed description and claims taken in conjunction with the accompanying drawings.

BRIEF DESCRIPTION OF THE DRAWINGS

FIG. 2 is a block diagram showing one generalized embodiment of a method for providing an adapter apparatus such as that shown generally in FIG. 1A.

FIG. 6 shows a top view of a jig for use in illustrating the placement of solder balls for multiple adapter apparatus like the apparatus shown in FIGS. 4A-4C.

DETAILED DESCRIPTION OF THE EMBODIMENTS

The present invention shall generally be described with reference to FIGS. 1-2. A more detailed description of one or more various embodiments of the present invention shall then be described with reference to FIGS. 3-6. It will be apparent to one skilled in the art that elements from one embodiment may be used in combination with elements of the other embodiments, and that the present invention is not limited to the specific embodiments described. Further, it will be recognized that the embodiments of the present invention described herein will include many elements that are not necessarily shown to scale. Further, it will be recognized that the size and shape of various elements herein may be modified without departing from the scope of the present invention, although one or more shapes and sizes may be advantageous over others.

Figure 1A:
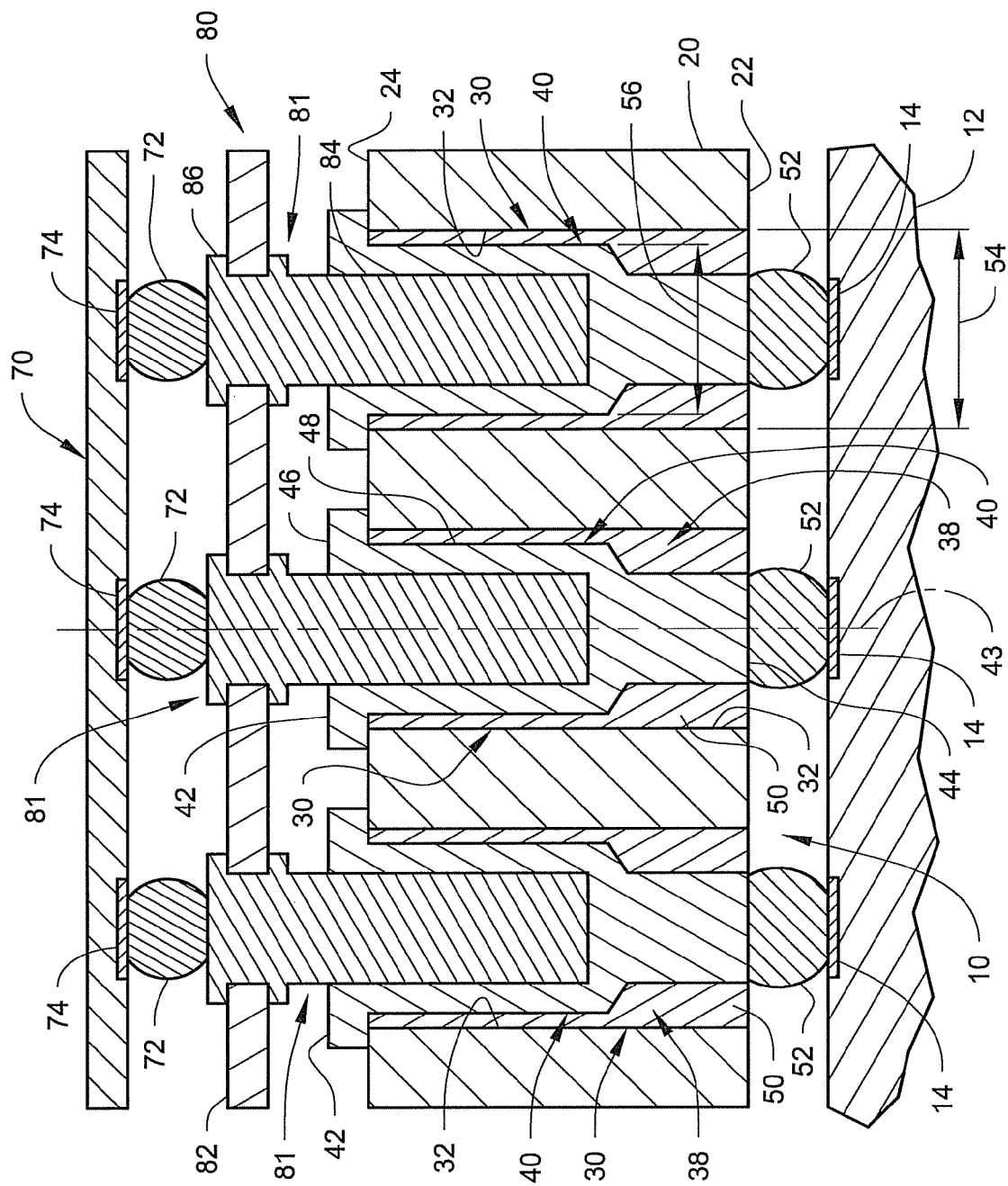
FIG. 1A is a generalized illustrative diagram of one exemplary embodiment of a portion of an adapter apparatus according to the present invention for use in mounting a packaged device relative to a target board.

FIG. 1A shows a generalized diagrammatic view of an adapter apparatus 10 according to the present invention. The adapter apparatus 10 includes a substrate 20. Substrate 20 comprises a body of material extending between a first surface 22 and a second surface 24. In one embodiment of substrate 20, the first surface 22 and the second surface 24 are planer surfaces that generally lie parallel to one another.

The substrate 20 may be formed of any suitable insulative material (e.g., polyimide materials). Preferably, substrate 20 is formed of a high temperature material (e.g., a material that is suitable for use in temperatures that exceed 125° C.). For example, the substrate 20 may be formed of one or more materials such as FR4, G10, Kapton, or Rogers R04350.

In one embodiment, the substrate 20 may be of a size generally equivalent to a packaged device (e.g., packaged device 70) which is to be mounted using the adapter apparatus 10. However, one skilled in the art will recognize that the size and shape of the substrate material 20 may vary based on the application of the adapter apparatus (e.g., the adapter apparatus may be configured to mount more than one packaged device).

The present invention may be used to mount various types of packaged devices, including, but not limited thereto, for example, surface mount devices, such as ball grid array packages, land grid array packages, micro lead frame (MLF) devices, column grid array packages, non-solder ball packages, other packaged devices with surface mount pads, etc. One will recognize that the configuration of the adapter apparatus may be different depending on the type of the packaged device being mounted (e.g., the apparatus being different or the same for a package including solder balls versus a non-solder ball package).

The substrate 20 includes a plurality of openings 30 defined through the substrate 20. The openings 30, as shown in FIG. 1A, are defined through substrate 20 from first surface 22 to second surface 24 of substrate 20 by one or more opening surfaces 32. The size and shape of the openings 30 will be dependent upon the conductive elements 40 to be mounted therein.

Conductive elements 40 are mounted in each opening 30 defined through the substrate 20. The conductive elements 40 are mounted in the openings 30 using a curable material 50.

Each conductive element 40 generally includes a body member 42 extending along an axis 43 from a first end 44 to a second end 46. At least the first end 44 is, at least in one embodiment, configured for receipt of solder material 52 (e.g., a solder ball, solder sphere, or column) thereon. Depending on the type of material used to form the conductive elements and the application of the adapter apparatus, at least in one embodiment, solder material may not be needed on the first end of the conductive element 40 (e.g., a gold first end that can be otherwise soldered to the target board without the need to prevent the first end from oxidation). Preferably, solder material is received on the first end 44 of the conductive element 40.

The body member 42 comprises an outer surface 48. When the conductive element 40 is positioned within an opening 30 of the adapter apparatus 10, a curable material receiving region 38 is formed between the outer surface 48 of the conductive element 40 and the opening surface or surfaces 32 defining opening 30 through substrate 20. Curable material 50 provided in the curable material receiving region 38 of the opening interfaces with both outer surface 48 of the conductive element 40 and the opening surface 32 defining opening 30.

Figure 1B:
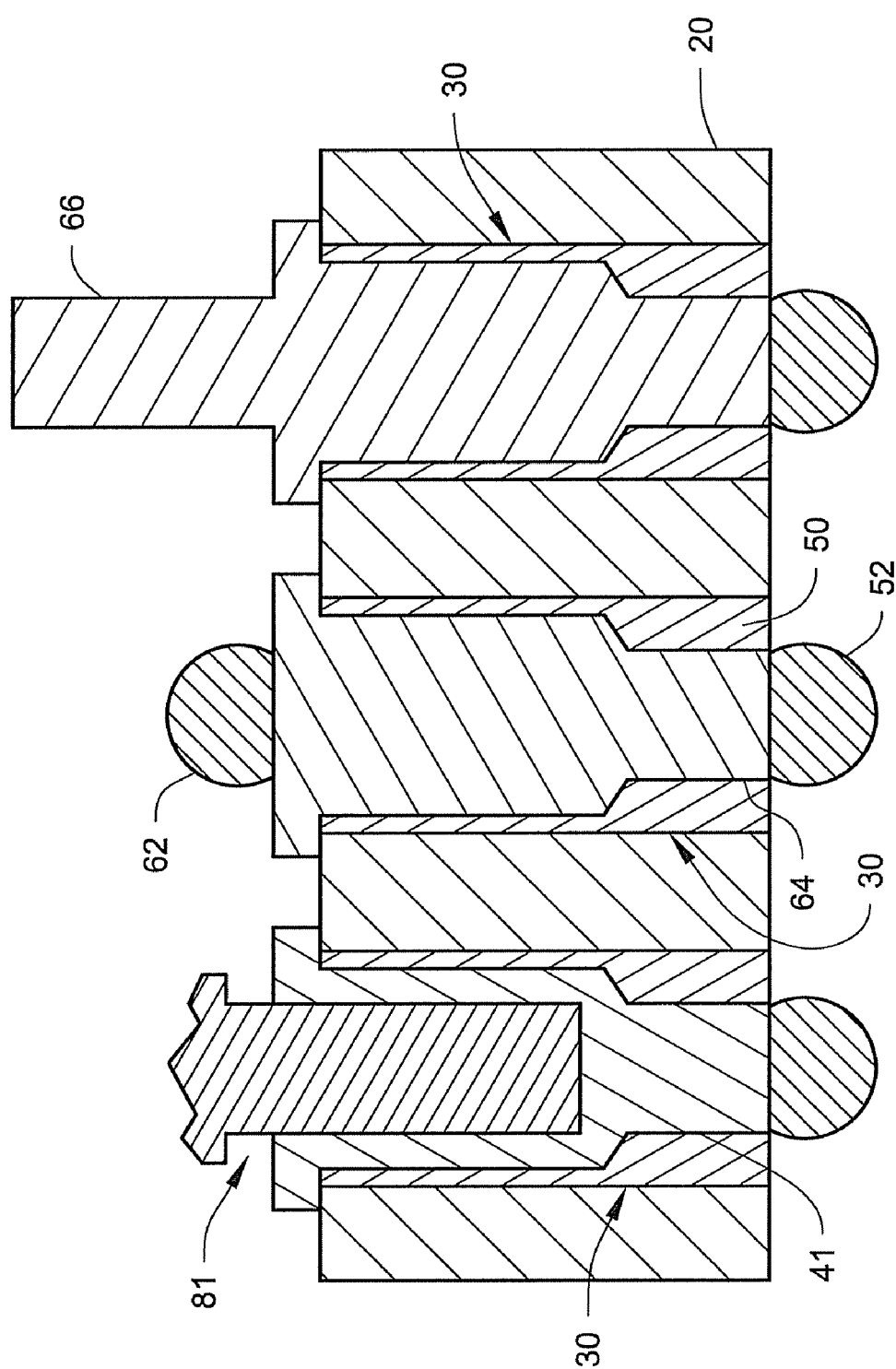
FIG. 1B is a generalized diagrammatic view of a portion of an adapter apparatus such as shown in FIG. 1A for use in illustrating various types of conductive elements that may be mounted in openings formed through a substrate of the adapter apparatus.

The conductive elements 40, as shown in FIG. 1A, include female socket pins mounted in corresponding openings 30 defined through substrate 20. However, as shown in FIG. 1B, the conductive elements may include any type of terminal configuration. For example, as shown in FIG. 1B, the conductive element may include a female socket pin 41 (e.g., like that shown in FIG. 1A), or may include a male terminal pin 66 as shown in FIG. 1B. In addition, the conductive element may even include a conductive element that has first and second ends configured to receive solder material on at least one or both of the ends (e.g., solder balls on both ends, solder ball on one end and solder film on another, etc.) as shown by conductive element 64 in FIG. 1B. The conductive element 64 is a conductive plug (i.e., an element that does not include either a female contact or a male contact at either end) has solders balls 52, 62 attached to respective ends thereof. However, the conductive element may have other solder materials provided thereon, or may not require any solder material on the ends at all. In other words, the type of conductive element mounted using a curable material according to the present invention will depend upon the particular application to be accomplished with the adapter apparatus.

For example, as shown in FIG. 1A and not to be considered limiting to the present invention, the adapter apparatus 10 is employed as a BGA surface mount emulator foot adapter to mount a packaged device 70 (e.g., a BGA package) to target board 12. Target board 12 includes a pattern of contact elements 14 corresponding to a plurality of solder balls 72 of the ball grid array device 70. The solder balls 72 are provided on a pattern of contact pads 74 of the ball grid array device 70.

Further, as shown in FIG. 1A, a pin adapter 80 is provided for use in mounting the ball grid array device 70 to the target board 12 using adapter apparatus 10. The pin adapter 80 includes a substrate 82 with a plurality of male terminal pins 81 mounted therethrough. Each of the male terminal pins 81 includes a pin portion 84 configured to be received in a female socket pin 40 of adapter apparatus 10 and a contact portion 86 for mating with a solder ball 72 of the BGA device 70.

In other words, as the adapter apparatus 10 includes female socket pins 40, a male pin adapter 80 is used to mount the BGA device 70. However, if the adapter apparatus 10 included a plurality of male terminal pins such as male terminal pins 66 shown in FIG. 1B, a female adapter (not shown) would be employed to mount the BOA device as opposed to the male pin adapter 80.

It will be recognized that any of the adapters described herein that include conductive elements mounted through openings formed in a substrate may be mounted using a curable material and/or one or more processes as described herein. For example, pin adapter 80 may include male terminal pins 81 mounted using curable material such as described herein. One skilled in the art will recognize that the use of curable material to mount conductive elements in openings defined through a substrate of an adapter apparatus is not limited to only the embodiments provided herein, but is applicable to any adapter apparatus that may benefit therefrom.

The conductive elements 40, as generally shown in FIG. 1A, as well as any other conductive elements which may be mounted in openings defined through substrate 20, may be formed of any suitable conductive material. For example, such conductive elements may be formed of brass alloy, gold, nickel, beryllium, or copper alloy. Yet further, various types of contact structures may be employed, as well as various different material types for such contact structures as would be know in the art.

Solder material 52 may include any suitable type of solder material generally known in the art. Such suitability will generally depend on the application for which the adapter apparatus is being used. For example, the solder material 52 may include solder balls as shown in FIG. 1A, solder films, solder spheres, partial solder spheres, solder columns, or any other suitable size and shape of material. Further, for example, the solder material may include eutectic 63/37 SnPb solder balls or solder spheres, or may be formed of lead free solder alloys such as SAC305 (Sn, Ag3.0, Cu0.5).

The curable material 50 may include any suitable curable adhesive material that provides insulative functionality. For example, such curable material may include UV-curable material or heat curable material (e.g., epoxy materials), or any other curable materials (e.g., acrylic materials). Further, for example, the curable material may be formed of an epoxy, such as DP-270, DP-100, or DP-420 epoxy available from 3M Corporation. Generally, the thermal characteristics of the cured material is preferably like those of the substrate material (e.g., similar thermal expansion coefficients).

Preferably, in one embodiment, the curable material 50 is a material that exists in a normal state at a first viscosity, but when treated (e.g., thermally treated) has a reduced viscosity for a particular period of time. Later, after further curing (e.g., thermal treatment), the viscosity of the curable material increases to a cured (e.g., hardened) state. Such a decrease in viscosity during the intermediate time period provides the benefit of easily removing excess material, as well as allowing the curable material 50 to flow and fill any voids in the curable material receiving regions 38 used to mount the conductive element 40 during the manufacturing process.

Further, preferably, curable material 50 proximate (e.g., at the entry of the opening 30) the first surface 22 of substrate 20 is formed so as to completely block entry of any material (e.g., solder) into the openings 30. For example, the entire curable material receiving region 38 radially about the conductive element 40 at the first surface 22 of the substrate 20, and at least a predetermined distance into the opening 30 from first surface 22, is entirely filled with curable material 50. When in a cured state, such material provides for blocking entry of material into the opening 30.

FIG. 2 provides a block diagram of a method 100 for providing an adapter apparatus such as that shown generally in FIG. 1A. The method 100 includes providing the substrate 20 having a plurality of openings 30 defined therethrough (block 102). For example, the openings 30 provided in substrate 20 may be formed by drilling holes in the substrate 20.

Generally, at least in one embodiment, the drill size for forming the opening (e.g., holes) may be equal to or up to 0.0005 inches larger than the largest feature of conductive element 40 that is to be inserted into the opening 30. In one embodiment, the holes are of a single diameter completely from the first surface 22 to the second surface 24. As shown in FIG. 1A, the diameter 54 of the hole 30 of opening 30 is slightly larger than the diameter 56, which is the largest feature of the conductive element 40 inserted into the opening 30.

The method 100 for providing the adapter apparatus 10 further includes inserting the plurality of conductive elements into corresponding defined openings 30 (block 104). Although any suitable insertion technique may be used, in one exemplary embodiment, vibrational loading of the conductive elements is employed as known to those skilled in the art.

As will be described further herein with reference to FIG. 5A, a spacing or positioning element extending from the outer surface 48 of the conductive element 40 may be used to maintain spacing between the outer surface 48 of the conductive element 40 and the one or more opening surfaces 32 which define the corresponding openings 30. In such a manner, the conductive element 40 is positioned in the center of the opening 30 forming a uniform curable material receiving region 38 radially about axis 43 between the one or more surfaces 32 and the outer surface 48 of the conductive element 40.

With the plurality of conductive elements 40 inserted into the corresponding defined openings or holes 30 (block 104), each of the conductive elements 40 is then mounted in a corresponding opening 30 using a curable material 50 (block 106). Thereafter, in one embodiment, solder material (e.g., solder balls 52) is provided on at least the first end of each conductive element 40 mounted in corresponding openings 30.

Figure 3A:
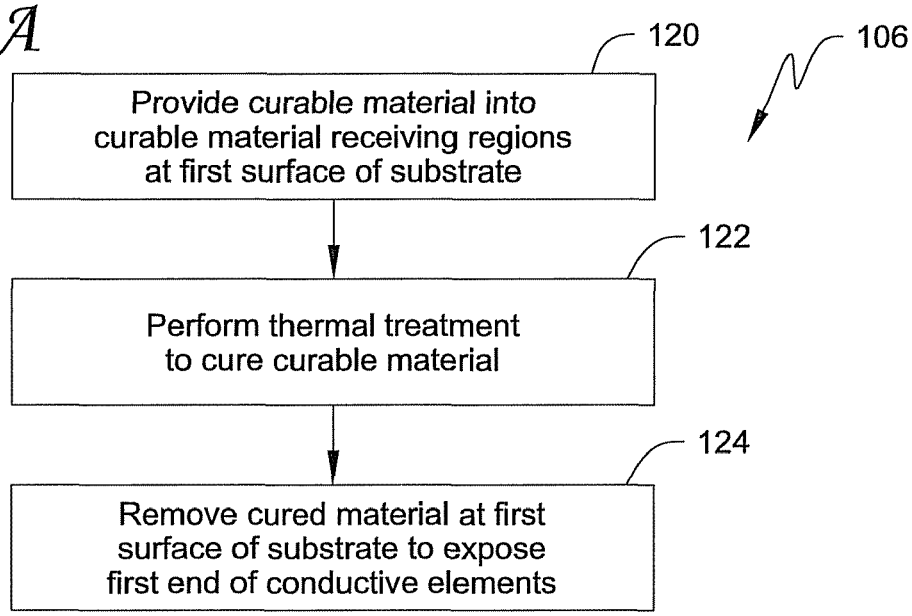
FIGS. 3A and 3B show exemplary embodiments of the curable material mounting process as shown generally in the method of FIG. 2.
Figure 3B:
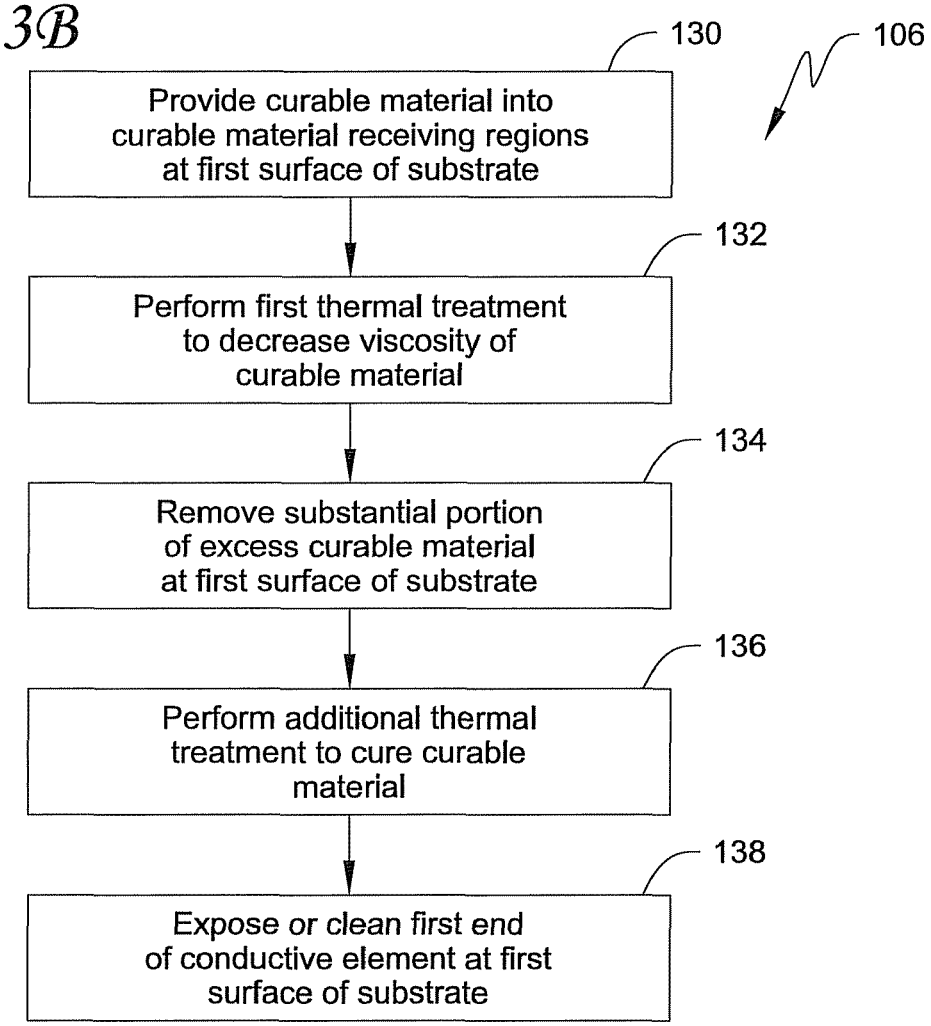

FIGS. 3A-3B show block diagrams of two alternate conductive element mounting processes 106 that may be used according to the present invention. As shown in FIG. 3A, curable material 50 is provided into the curable material receiving regions 38 at the first surface 22 of the substrate 20 (block 120). For example, the curable material may be provided with any suitable devices, such as dispensing devices, spinning devices, spreading devices (e.g., squeegee devices), etc. The present invention is not limited to any particular device. However, at least in one embodiment, a device for forcing some of the curable material 50 into the curable material receiving regions 38 is used.

In one embodiment, a thermal treatment is used to cure the curable material 50 (block 122) received in the openings 30. However, depending on the type of curable material employed, other curing steps may be required (e.g., ultraviolet light application for a UV curable material). Further, in one embodiment, vibration in combination with thermal treatment may used (e.g., so as to assist in reducing any voids in the cured material). After thermal treatment, excess cured material is removed at the first surface 22 of the substrate 20 to expose the first ends 44 of the conductive elements 40 (block 124) for attachment of solder material 52. One skilled in the art will recognize that the range of time and temperature required to cure the material will depend at least on the type of curable material used.

One will recognize that the curable material 50 may entirely fill the curable material receiving region 38 defined between the outer surface 48 of the conductive element 40 and the one or more opening surfaces 32 defining opening 30, or may only partially fill the curable material receiving region 38. At least in one embodiment, the curable material receiving region 38 radially about the conductive element 40 and proximate the first surface 22 is entirely filled between the outer surface 48 and the opening surface 32 such that when cured, any foreign material is substantially blocked from entering into the corresponding opening. For example, when the solder material 52 (e.g., solder balls) is reflowed for coupling onto the first ends 44 of the conductive elements 40, solder is prevented from entering the openings 30.

Further, in one or more embodiments, a curable material blocking element extending from the outer surface 48 may be used to prevent curable material 50 used to mount the conductive element 40 from flowing between a first portion of the opening to a second portion of the opening. Such an element will be further described with reference to FIG. 5A. In one embodiment, the spacing element or elements used to position the conductive element 40 symmetrically within opening 30 along axis 43 prior to application of the curable material 50 is the same element or elements used to provide the curable material blocking element function (see the description with reference to FIG. 5A).

As shown in FIG. 3B, curable material 50 is provided into the curable material receiving regions 38 at first surface 22 of substrate 20 (block 130). A first thermal treatment is performed to decrease the viscosity of the curable material 50 (block 132). This decrease in viscosity allows the curable material 50 to more easily flow into position in the curable material receiving region 38 and fill the desired portions of region 38 without leaving voids therein.

After the first thermal treatment, a substantial portion of excess curable material 50 at first surface 22 of substrate 20 is removed (block 134). For example, such material may be removed by a straight edge, moved along the first surface 22. However, any process or apparatus available to remove such material may be used.

After removal of a substantial portion of the excess curable material 50 (block 134), additional thermal treatment is performed to cure the curable material 50 (block 136). Thereafter, any excess cured material is removed at first surface 22 of substrate 20 such that exposed first ends 44 are presented for receiving solder material 52. In other words, removal of cured material is performed to expose the first ends 44 of the conductive elements 40 (block 138).

Various processes and/or apparatus may be used to remove excess curable material and/or cured material during processing. For example, planarization techniques may be used to remove cured material, wet and/or dry etching may be used to remove materials, sanding may be used to remove materials (e.g., using an abrasive article), and/or vertical milling may be used to remove materials.

Providing solder material 52 on the first ends 44 (e.g., attachment of solder balls to the first ends 44) of the conductive elements 40 may be performed by any suitable process. For example, cleaning of the first ends 44 may be performed, solder flux may be applied to the first ends, and thermal treatment may be employed to attach solder balls that are applied to the first ends 44. Further, various types of devices may be used to position the solder balls on the first ends 44, such as, for example, a jig as described with reference to FIG. 6. However, the present invention is not limited to any particular application technique for providing the solder material 52 onto the first ends 44 of the conductive elements 40 (e.g., film deposition techniques may be used to apply a solder film, columns may be provided, etc.).

Figure 4A:
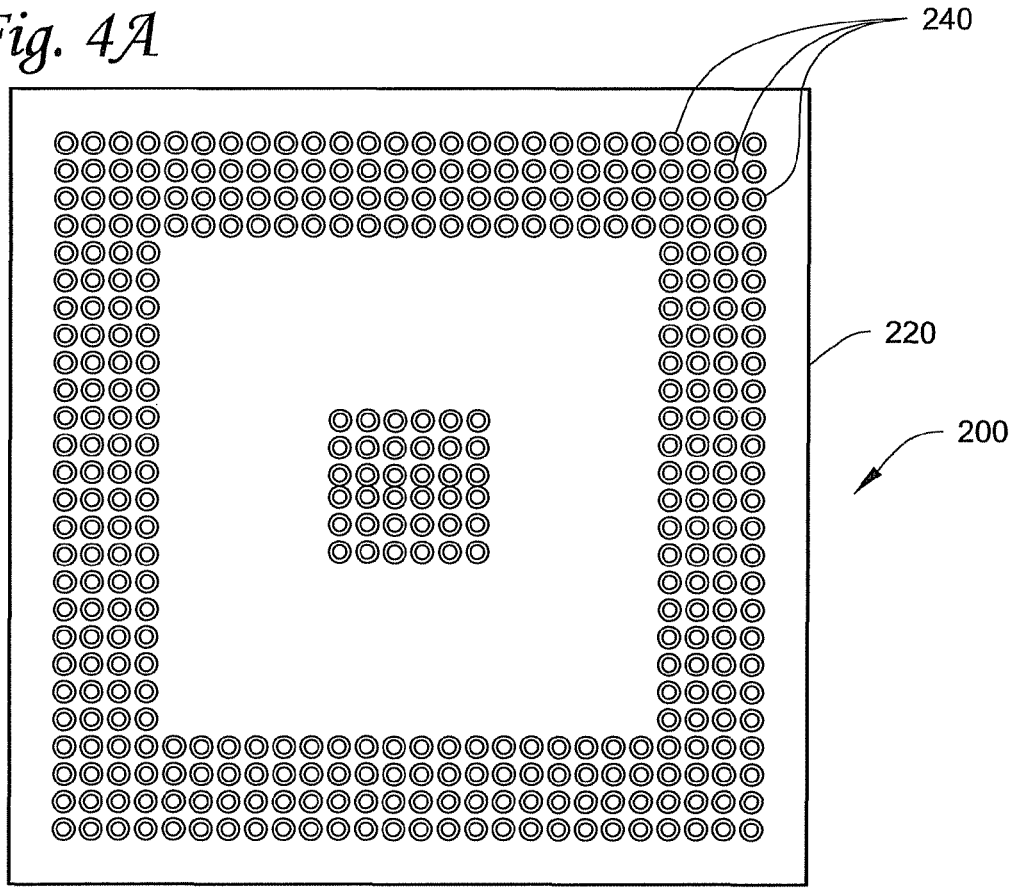
FIGS. 4A-4C show a plan view, a side view, and a partial cross-section view, respectively, of one exemplary embodiment of an adapter apparatus according to the present invention.
Figure 4B:
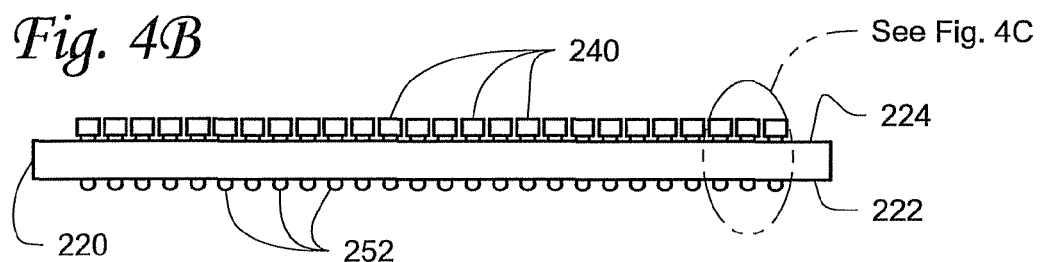
Figure 4C:
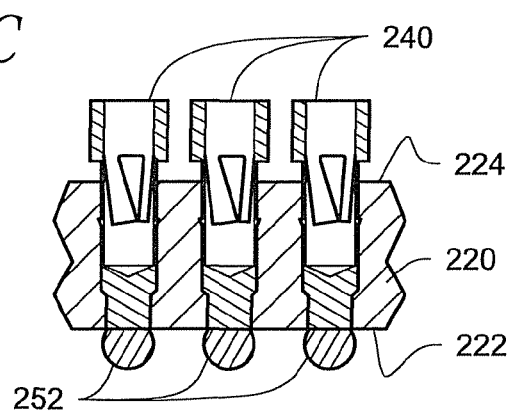

FIGS. 4A-4C show a top plan view, a side view, and a partial cross section view, respectively of an illustrative embodiment of an adapter apparatus 200 according to the present invention. The adapter apparatus 200 includes a substrate 220, including a first surface 222 and a second surface 224 spaced apart therefrom. The adapter apparatus 200 further includes conductive elements 240 mounted within openings 230 defined through substrate 220 from first surface 222 to second surface 224. The conductive elements 240 are mounted within the openings 230 using a curable material 238 as shown in further detail in the cross sectional detail view of FIG. 5A. Solder balls 252 are secured at first ends 244 of the conductive elements 240 as shown in FIG. 4C.

Figure 5A:
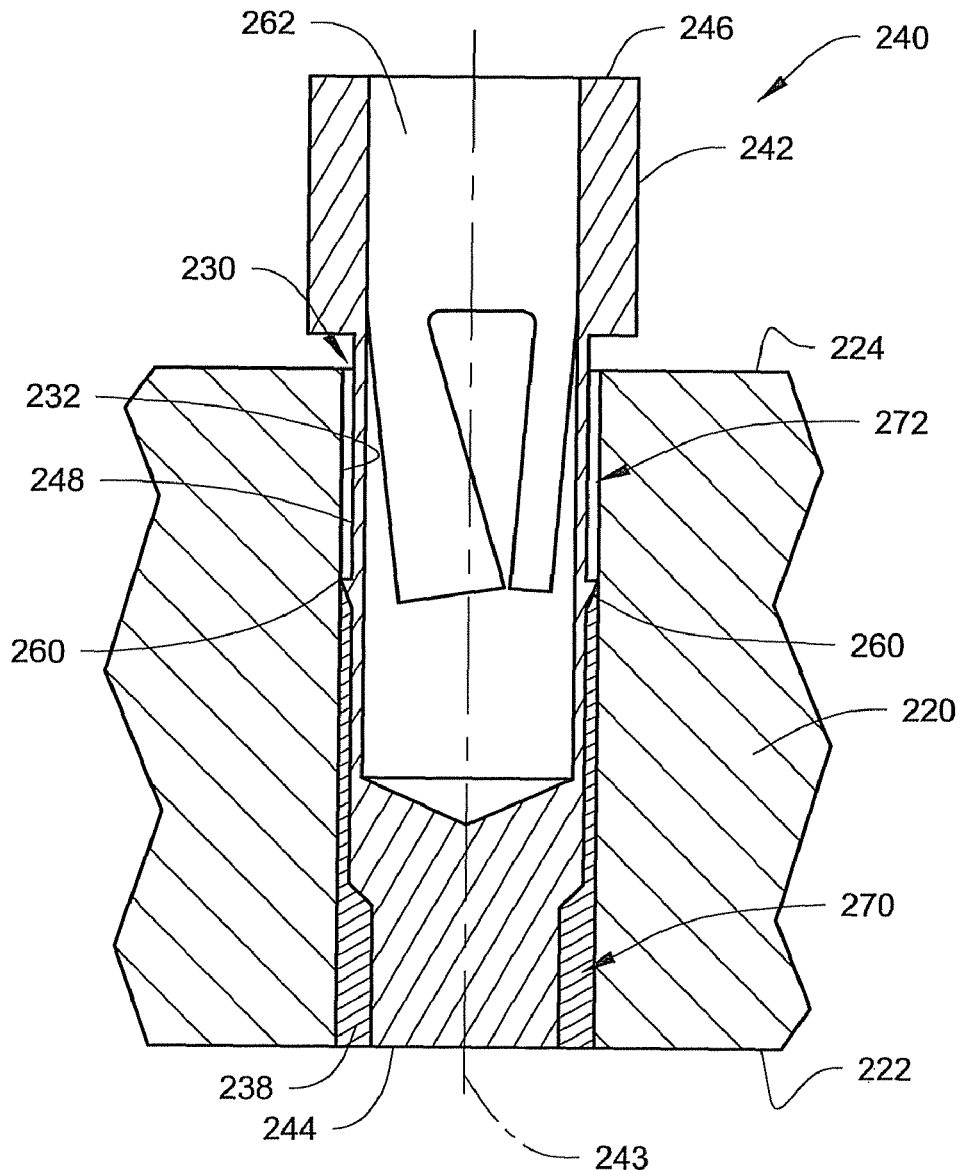
FIG. 5A shows a more detailed cross-sectional view of one conductive element mounted in an opening of an adapter apparatus such as that shown in FIGS. 4A-4C.

FIG. 5A shows the mounting of the conductive element 240 in a corresponding opening 230; the opening 230 defined through substrate 220 from first surface 222 to second surface 224. The opening 230 is defined by one or more opening surfaces 232 (e.g., a surface defined by drilling a hole through the substrate 220).

Figure 5B:
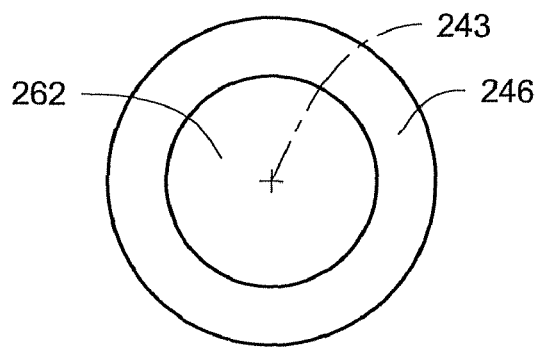
FIG. 5B shows a top view of the conductive element shown in FIG. 5A.

FIG. 5B shows a top view of the conductive element 240, which includes a body member 242 extending along axis 243 from a first end 244 to a second end 246. The first end 244 is exposed for receiving a solder ball 252 thereon, whereas the second end 246 includes a receiving region 262 defined therein for receiving and mating with a male terminal pin. The body member 242 includes an outer surface 248; a portion of which interfaces with curable material 238 used to mount the conductive element 240 (e.g., a female socket pin) in opening 230 defined in substrate 220.

As shown in FIG. 5A, a spacing and/or curable material blocking element 260 extends from the outer surface 248 of the conductive element 240. In one exemplary embodiment, the spacing and/or curable material blocking element 260 is an annular ring of material about axis 243 extending outward from axis 243 a relatively small distance further than outer surface 248.

The spacing or positioning element and/or curable material blocking element 260 maintains spacing between the outer surface 248 of the conductive element 240 and opening surface 232 defining opening 230 in which the conductive element 240 is mounted. Further, the element 260 prevents the curable material 238 used to mount the conductive element 240 in the opening 230 from passing from the first portion 270 of the opening 230 (e.g., the curable material receiving region) to a second portion 272 of opening 230. As such, the curable material 238 is prevented from spreading to undesirable locations and is maintained within a certain portion 230 adequate for mounting the conductive element 240 in the opening 230.

At least in one embodiment, the curable material blocking element and/or positioning element 260 is formed of a size to contact opening surface 232. However, without the conductive element 240 being mounted in opening 230 using curable material 238, the conductive element 240 may move within opening 230 even though element 260 is present. Further, in one or more embodiments, a force less than 10 pounds can dislodge the conductive element from the opening when inserted but not yet mounted using the curable material even though element 260 is present. Further, even a force less than 5 pounds, and as low as 1 pound can dislodge the conductive element from the opening when inserted but not yet mounted using the curable material.

Although various conductive element mounting processes may be used to mount conductive element 240 in opening 230 defined through substrate 220, one or more exemplary conductive element mounting processes are provided herein. One will recognize that the steps of such processes may vary and the present invention is not limited to any particular described mounting process. However, one or more of such process steps may be beneficial in providing an adapter apparatus.

One embodiment of a general procedure for manufacturing the pin adapter apparatus with the solder balls 252 on one end includes the following:

1. Drill a panel (e.g., the substrate 220) with a drill size equal to or up to 0.0005 inch larger than largest feature on the conductive element (e.g., female socket pin 240) that is inserted into hole 230. For example, the drill size may be 0.026 inch. The panel may contain any number of adapter apparatus 200 to be built simultaneously (e.g., a panel of nine adapter apparatus may be formed in one process such as a process that would use the jig shown in FIG. 6).
2. Load the conductive elements (e.g., female socket pins) in all patterns drilled in the panel (e.g., substrate 220). Push the conductive elements (e.g., female socket pins 240) into the openings 230 such that the bottom (e.g., first end 244) of the conductive elements 240 where solder balls 252 are to be attached are flush with the substrate surface 222.
3. Completely coat the substrate surface 222 over the female socket pins 240 (e.g., solder ball side where the solder balls 252 are to be attached) with the curable material 238, e.g., DP-270 epoxy available from 3M Company. In one embodiment, the coating is made as thick as possible, but it is also desirable to make sure there are no voids around the ends 244 of the female socket pins 240.
4. Thermally treat the apparatus (e.g., using an oven) including the curable material, e.g., DP-270 epoxy, for 5 minutes at 93° C. and then remove it from oven. As the curable material 238 is not yet fully cured, a tool such as a single straight edge can be used to remove as much excess epoxy as possible. The apparatus should be observed such that any voids in the epoxy can be filled. There should be little or no epoxy on the substrate surface 222. The thermal treatment, allows the epoxy to fill all voids as it becomes less viscous.
5. Continue to thermally treat the apparatus to cure the curable material 238 in, for example, the oven for 25 more minutes at 93° C.
6. Remove the apparatus from the oven and (e.g., after it is fully cured) sand or grind the substrate surface 222 (e.g., solder ball side down) until the first ends 244 of the female socket pins 240 are exposed (e.g., not gold or are free of epoxy film).
7. Check for voids in the cured material about the female socket pins 240.
8. Attach solder balls 252 on the first ends 244 of the female socket pins and then inspect the apparatus 220. One exemplary method of attaching solder balls 252 is described below with reference to FIG. 6 and uses, for example, a solder ball jig (e.g., FR4 that is 0.020 inches thick and that has hole diameters drilled therein that may be 0.033±0.001 for receiving the solder balls 52). The jig may include alignment mechanisms, such as holes, pins, etc. that may be used in the jig along with perimeter holes, for aligning the substrate or panel 220 with the jig for attachment of the solder balls 252.
9. Break boards out of panel or substrate 220, if a panel includes multiple adapter apparatus. Further, the edges may be smoothed (e.g., sanded).

Another embodiment of a general procedure for manufacturing the pin adapter apparatus 200 with the solder balls 252 on one end includes the following:

1. Drill a panel (e.g., the substrate 220) with a drill size equal to or up to 0.0005 inch larger than largest feature on the conductive element (e.g., female socket pin 240) that is inserted into hole 230. For example, the drill size may be 0.0256 inch. The panel may contain any number of adapter apparatus 200 to be built simultaneously (e.g., a panel of nine adapter apparatus may be formed in one process such as a process that would use the jig shown in FIG. 6).
2. Load the conductive elements (e.g., female socket pins) in all patterns drilled in the panel (e.g., substrate 220). Push the conductive elements (e.g., female socket pins 240) into the openings 230 such that the bottom (e.g., first end 244) of the conductive elements 240 where solder balls 252 are to be attached are flush with the substrate surface 222.
3. Completely coat the substrate surface 222 over the female socket pins 240 (e.g., solder ball side where the solder balls 252 are to be attached) with the curable material 238, e.g., DP-270 epoxy available from 3M Company. In one embodiment, the coating is made as thick as possible, but it is also desirable to make sure there are no voids around the ends 244 of the female socket pins 240.
4. Thermally treat the apparatus (e.g., using an oven) including the curable material, e.g., DP-270 epoxy, for 30 minutes at 93° C. to cure the curable material.
5. Remove the apparatus from the oven and (e.g., after it is fully cured) machine (e.g., planarize) the apparatus at the first surface 222 of the substrate 220 to 0.066 inch from the surface 222.
6. Attach solder balls 252 on the first ends 244 of the female socket pins and then inspect the apparatus 220.
7. Break boards out of panel or substrate 220, if a panel includes multiple adapter apparatus. The female socket pins 240 are masked with packing tape to eliminate getting material inside female socket pins 240. Further, the edges may be smoothed (e.g., sanded).

FIG. 6 shows one illustrative embodiment of a jig 300 that may be used to attached solder balls 252 to nine adapter apparatus 200 such as those shown above (e.g., formed in a nine device panel). In one embodiment, the jig 300 includes a substrate material 301, such as FR4 that is 0.020 inches thick. The substrate material 301 includes a plurality of holes 302 drilled therein (e.g., holes that may be 0.033±0.001 inches) for receiving the solder balls 252. The jig 300 may include alignment mechanisms, such as holes, pins, etc. that may be used in the jig 300 along with perimeter holes 304, for aligning the substrate or panel 220 (e.g., panel including nine adapter apparatus 200) with the jig 300 for attachment of the solder balls 252.

One embodiment of the process for attaching the solder balls includes:
1. Putting flux on all the pads (e.g., ends 244 of the inserted female socket pins 240 on which solder balls 252 are to be attached).
2. Put the jig 300 precisely onto the panel or substrate 220 (e.g., various jig alignment structures may be used to provide such precise alignment, such as openings and alignment pegs).
3. Spread the solder balls 252 over the jig 300 such that there is one solder ball 252 in each hole 302 on the jig 300.
4. Remove any excess solder balls 252.
5. Reflow the assembly in an oven.
6. Remove the jig 300.

All patents, patent documents, and references cited herein are incorporated in their entirety as if each were incorporated separately. This invention has been described with reference to illustrative embodiments and is not meant to be construed in a limiting sense. As described previously, one skilled in the art will recognize that other various illustrative applications may use the techniques as described herein to take advantage of the beneficial characteristics of the apparatus and methods described herein. Various modifications of the illustrative embodiments, as well as additional embodiments of the invention, will be apparent to persons skilled in the art upon reference to this description.

What is claimed is:

1. A method for use in forming an adapter apparatus, wherein the method comprises:
   providing a substrate including a plurality of openings defined therethrough, wherein each of the plurality of openings is defined by at least one opening surface, wherein each of the plurality of the openings is configured to receive one of a plurality of conductive elements;
   inserting each of the plurality of conductive elements into a corresponding opening of the plurality of the openings such that a curable material receiving region is provided in each opening between at least a portion of the at least one opening surface defining the opening and the conductive element inserted therein;
   mounting each of the plurality of conductive elements in the corresponding opening using a curable material provided to the curable material receiving regions, wherein mounting each of the plurality of conductive elements in the corresponding opening using a curable material provided to the curable material receiving region comprises:
   providing curable material to the curable material receiving region;
   thermally treating the curable material to decrease the viscosity of the curable material;
   removing excess curable material having the decreased viscosity prior to further thermal treatment to cure the curable material;
   curing the curable material to mount the conductive element in the corresponding opening; and
   removing excess cured material to expose the first end of the conductive element.

2. The method of claim 1, wherein one or more of the plurality of conductive elements comprises at least a first end for receiving solder material thereon, and wherein the method further comprises positioning solder material on the first end of one or more of the plurality of conductive elements mounted in the plurality of openings.

3. The method of claim 1, wherein each of the plurality of conductive elements comprises a body member extending between a first end and a second end, wherein the first end is accessible at a first surface of the substrate when the conductive element is mounted in the corresponding opening, and further wherein mounting each of the plurality of conductive elements in the corresponding opening using the curable material comprises completely blocking entry of material into the corresponding opening after the curable material proximate the first surface of the substrate is cured.

4. The method of claim 1, wherein mounting each of the plurality of conductive elements in the corresponding opening using a curable material comprises filling the curable material receiving region entirely or at least partially to hold the conductive element in position within the corresponding opening.

5. The method of claim 1, wherein at least one of the plurality of conductive elements comprises a female socket pin, a male terminal pin, or a conductive plug element.

6. The method of claim 5, wherein at least one of the plurality of conductive elements comprises a female socket pin.

7. The method of claim 1, wherein inserting each of the plurality of conductive elements into a corresponding opening of the plurality of the openings comprises positioning each of the plurality of conductive elements in the corresponding opening such that spacing between an outer surface of the conductive element and one or more opening surfaces defining the corresponding opening is maintained as the conductive element is mounted in the corresponding opening.

8. The method of claim 1, wherein the method further comprises preventing curable material used to mount the conductive element from passing between a first portion of the corresponding opening to a second portion of the corresponding opening when the conductive element is mounted therein.

9. The method of claim 1, wherein the plurality of conductive elements are mounted in the plurality of openings configured to correspond to a contact element pattern of a surface mount device.

* * * * *